(12) United States Patent
Kim et al.

(10) Patent No.: US 10,818,373 B2
(45) Date of Patent: Oct. 27, 2020

(54) MEMORY DEVICE AND TEST CIRCUIT THEREOF

(71) Applicant: SK hynix Inc., Gyeonggi-do (KR)

(72) Inventors: Young-Hoon Kim, Gyeonggi-do (KR); Kwang-Soon Kim, Gyeonggi-do (KR); Sang-Kwon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 119 days.

(21) Appl. No.: 16/234,843

(22) Filed: Dec. 28, 2018

(65) Prior Publication Data

US 2020/0035320 A1 Jan. 30, 2020

(30) Foreign Application Priority Data

Jul. 24, 2018 (KR) .................. 10-2018-0086050

(51) Int. Cl.
| | |
|---|---|
| G11C 29/38 | (2006.01) |
| G11C 11/4096 | (2006.01) |
| G11C 11/4093 | (2006.01) |
| G11C 7/10 | (2006.01) |

(52) U.S. Cl.
CPC .......... *G11C 29/38* (2013.01); *G11C 11/4093* (2013.01); *G11C 11/4096* (2013.01); *G11C 7/1069* (2013.01); *G11C 2207/107* (2013.01)

(58) Field of Classification Search
CPC . G11C 29/38; G11C 11/4093; G11C 11/4096; G11C 2207/107; G11C 7/1069
USPC .......................... 714/719, 718; 365/200, 201
See application file for complete search history.

(56) References Cited

U.S. PATENT DOCUMENTS

| | | | | |
|---|---|---|---|---|
| 7,499,356 | B2* | 3/2009 | Do | G11C 29/26 |
| | | | | 365/201 |
| 7,583,557 | B2* | 9/2009 | Do | G11C 29/1201 |
| | | | | 365/230.05 |
| 7,701,800 | B2* | 4/2010 | Chung | G11C 7/1075 |
| | | | | 365/201 |
| 7,773,439 | B2* | 8/2010 | Do | G11C 7/1075 |
| | | | | 365/201 |
| 10,666,467 | B2* | 5/2020 | Kwon | G11C 7/02 |
| 2005/0034009 | A1* | 2/2005 | Sutardja | G06F 13/405 |
| | | | | 713/503 |
| 2007/0073980 | A1* | 3/2007 | Chung | G06F 13/28 |
| | | | | 711/149 |
| 2007/0073981 | A1* | 3/2007 | Im | G11C 8/16 |
| | | | | 711/149 |
| 2007/0260925 | A1* | 11/2007 | Do | G11C 29/48 |
| | | | | 714/30 |

(Continued)

FOREIGN PATENT DOCUMENTS

| | | |
|---|---|---|
| KR | 1020090115876 | 11/2009 |
| KR | 1020100033182 | 3/2010 |

*Primary Examiner* — John J Tabone, Jr.
(74) *Attorney, Agent, or Firm* — IP & T Group LLP (57) ABSTRACT

A memory device includes a plurality of memory cell arrays, a plurality of data transmitters corresponding to the plurality of memory cell arrays, respectively, and suitable for transmitting data read in parallel from the corresponding memory cell arrays, and a test circuit suitable for selecting one data transmitter among the plurality of data transmitters, and sequentially outputting data transmitted in parallel from the selected data transmitter to one data input/output pad among a plurality of data input/output pads, during a test mode.

20 Claims, 4 Drawing Sheets

(56) References Cited

U.S. PATENT DOCUMENTS

| | | | | |
|---|---|---|---|---|
| 2008/0273623 A1* | 11/2008 | Chung | ................ | H04L 25/0264 |
| | | | | 375/295 |
| 2009/0213659 A1* | 8/2009 | Lee | ........................ | G11C 16/32 |
| | | | | 365/185.18 |
| 2019/0096447 A1* | 3/2019 | Jang | ........................ | G11C 7/222 |
| 2019/0158320 A1* | 5/2019 | Kwon | .................. | G11C 13/004 |

* cited by examiner

MEMORY DEVICE AND TEST CIRCUIT THEREOF

CROSS-REFERENCE TO RELATED APPLICATION

This application claims priority under 35 U.S.C. § 119 to Korean Patent Application No. 10-2018-0086050 filed on Jul. 24, 2018, which is incorporated herein by reference in its entirety.

BACKGROUND

1. Field

Exemplary embodiments relate to a memory device, and more particularly, to a test circuit for performing a test operation of a memory device.

2. Discussion of the Related Art

A memory system may be used as a main memory device or secondary memory device of various electronic devices for consumer or industry use. For example, the electronic devices include a computer, mobile phone, portable digital assistant (PDA), digital camera, game machine, navigation system and the like. Memory devices for implementing the memory system may be divided into volatile memory devices such as a dynamic random access memory (DRAM) and static RAM (SRAM), and nonvolatile memory devices such as a read only memory (ROM), mask ROM (MROM), programmable ROM (PROM), erasable programmable ROM (EPROM), electrically erasable programmable ROM (EEPROM), ferroelectric RAM (FRAM), phase-change RAM (PRAM), magnetoresistive RAM (MRAM), resistive RAM (RRAM or ReRAM) and flash memory.

A memory device may include a plurality of memory cells for storing data. As the integration density of the memory device is increased, the number of memory cells is increased, and more time and cost are required to test the memory cells. Therefore, in order to test the memory device, a parallel test scheme may be applied.

For example, when a plurality of DRAM chips is tested, only one of data input and output (input/output) pads of the DRAM chips may be used to write test data to the DRAM chips. That is, the test data may be inputted through one data input/output pad, and then copied and stored into corresponding memory cells of the plurality of DRAM chips. Through a read operation, data may be read from the corresponding memory cells of the plurality of DRAM chips and then compared. According to the comparison result, the memory device may determine whether the same data are stored in the corresponding memory cells of the plurality of DRAM chips, and the determination result may be outputted as a test pass/fail through one data input/output pad.

Through the test operation, the memory device may check only whether a defect occurred in a memory cell in case of a test fail, but may not check the address of the memory cell in which the defect occurred. When the test data are read through all of the data input/output pads of the plurality of DRAM chips, the address of the memory cell having the defect may be checked. However, since the number of probe pins included in test equipment coupled to the data input/output pads is fixed, the number of DRAM chips which may be simultaneously tested by the test equipment is reduced. As a result, the test time of the memory device may be increased while the process cost of the memory device is increased. Therefore, there is a demand for a test circuit and a test method for a memory device, which may reduce the time and cost required for testing the memory device.

SUMMARY

Various embodiments are directed to a test circuit capable of controlling data inputted to/outputted from a memory device according to a test operation of the memory device.

In an embodiment of the present invention, a memory device includes: a plurality of memory cell arrays; a plurality of data transmitters corresponding to the plurality of memory cell arrays, respectively, and suitable for transmitting data read in parallel from the corresponding memory cell arrays; and a test circuit suitable for selecting one data transmitter among the plurality of data transmitters, and sequentially outputting data transmitted in parallel from the selected data transmitter to one data input/output pad among a plurality of data input/output pads, during a test mode.

In an embodiment of the present invention, a memory device includes: a plurality of data input/output line groups; a plurality of serializers corresponding to the respective data input/output line groups and suitable for serializing data transmitted through data input/output lines of the corresponding groups; and a test circuit suitable for selecting one of the data input/output line groups, and outputting data transmitted through data input/output lines of the selected group to one serializer of the serializers, during a test mode.

In an embodiment of the present invention, a memory device includes: a plurality of memory cell arrays; a plurality of data transmitters corresponding to the plurality of memory cell arrays, respectively, each data transmitter suitable for receiving data from the corresponding memory cell arrays, and transmitting the received data; a plurality of data input/output line groups corresponding to the plurality of data transmitters, respectively; a plurality of serializers, each serializer coupled to the corresponding data transmitter through corresponding data input/output line group and coupled to a corresponding data pad among a plurality of data pads, suitable for serializing data from the corresponding data transmitter; and a test circuit including at least one selection unit coupled to the plurality of data transmitters through a plurality of lines, suitable for receiving data from one data transmitter, which is sequentially selected from among the plurality of data transmitters, and outputting data from the sequentially selected one data transmitter to the selected one data pad from among the plurality of data pads through the corresponding serializer such that the corresponding serializer serializes data from the one selection unit and transmits the serialized data to the selected one data pad.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Moreover, detailed descriptions related to well-known functions or configurations will be omitted in order to clearly describe the subject matters of the present invention. Throughout the disclosure, like reference numerals refer to like parts throughout the various figures and embodiments of the present invention.

Figure 1:
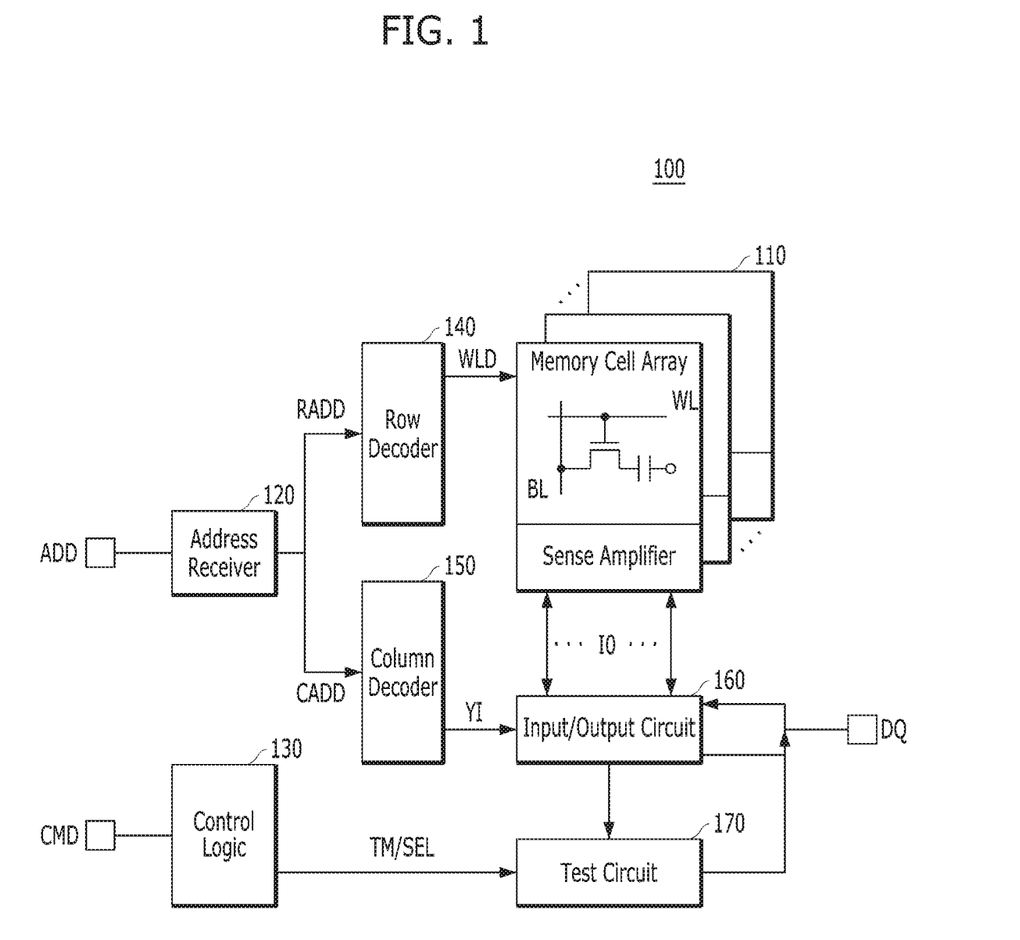
FIG. 1 is a block diagram illustrating a memory device in accordance with an embodiment of the present invention.

FIG. 1 is a block diagram illustrating a memory device 100 in accordance with an embodiment of the present invention. Referring to FIG. 1, the memory device 100 may include a plurality of memory cell arrays 110, an address receiver 120, a control logic 130, a row decoder 140, a column decoder 150, an input and output (input/output) circuit 160, and a test circuit 170.

Each of the memory cell arrays 110 may include a plurality of memory cells coupled between a plurality of bits lines BL and a plurality of word lines WL. The memory cell arrays 110 may correspond to sense amplifiers, respectively. Data read from/written to the plurality of memory cells may be sensed and amplified by the sense amplifiers.

The address receiver 120 may receive an address from outside through an address terminal ADD. The address receiver 120 may generate a row address RADD and a column address CADD from the received address. The address receiver 120 may include a register to store and then output the received address.

According to the row address RADD, the row decoder 140 may select a corresponding row, i.e., word line WL in the memory cell array 110. The row decoder 140 may generate a word line driving signal WDL indicating the corresponding word line WL by decoding the row address RADD.

According to the column address CADD, the column decoder 150 may select a corresponding column or input/output line IO in the memory cell array 110. The column decoder 150 may generate a column select signal YI indicating the corresponding input/output line IO by decoding the column address CADD.

The control logic 130 may generate an internal command according to signals inputted from outside through a command terminal CMD. In particular, when a combination of the signals inputted from outside indicates a test mode, the control logic 130 may generate a test mode signal TM or select signal SEL for controlling the test circuit 170. The control logic 130 may include a command decoder, a mode register set and the like. The control logic 130 may generate the test mode signal TM or the select signal SEL based on a value set in the mode register set, according to the combination of the signals inputted from outside.

The input/output circuit 160 may be coupled to the memory cell arrays 110 through the input/output lines IO. In response to the column select signal YI generated by the column decoder 150, the input/output circuit 160 may transmit data between the input/output lines IO and a data input/output pad DQ.

The test circuit 170 may be coupled to the input/output lines IO through the input/output circuit 160. The test circuit 170 may perform a test operation in response to the test mode signal TM or the select signal SEL generated through the control logic 130. During a test mode, the test circuit 170 may receive data from the input/output lines IO, and output data obtained through the test operation to the data input/output pad DQ. The configurations of the input/output circuit 160 and the test circuit 170 in accordance with the present embodiment will be described in more detail with reference to FIGS. 2 and 3.

Figure 2:
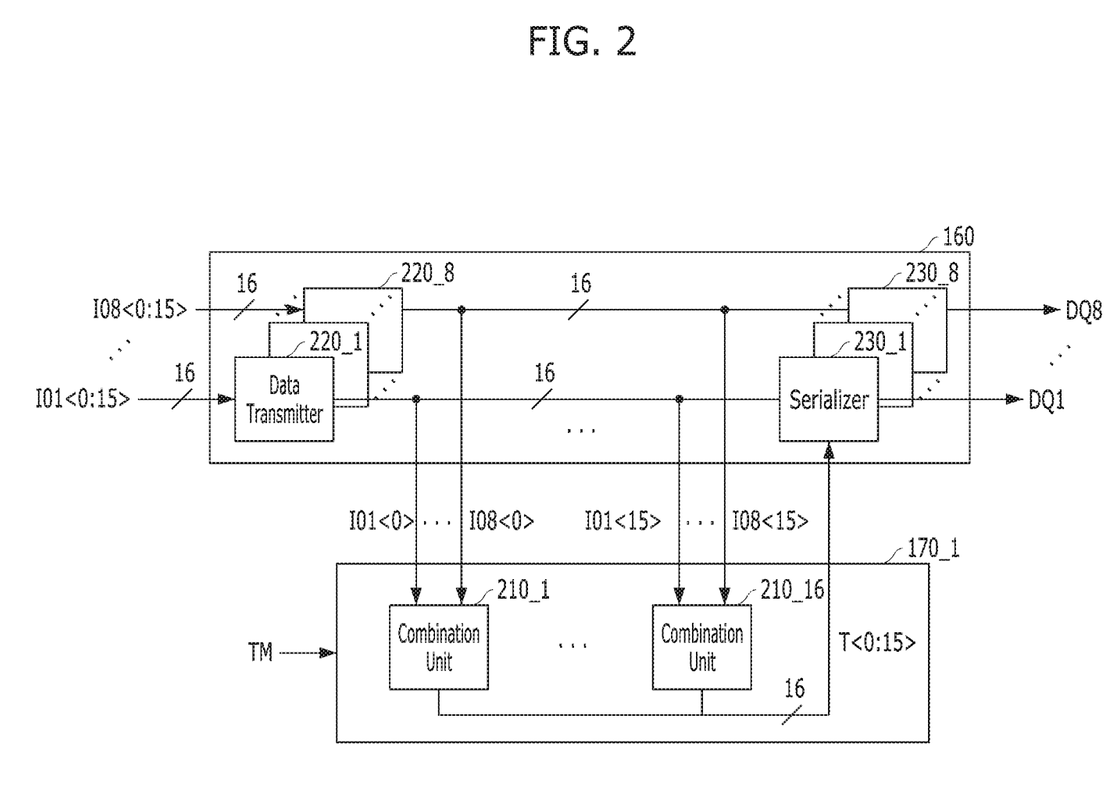
FIG. 2 is a block diagram illustrating an input/output circuit and a test circuit in accordance with an embodiment of the present invention.

FIG. 2 is a block diagram illustrating an input/output circuit and a test circuit in accordance with an embodiment of the present invention, for example, the input/output circuit 160 and the test circuit 170, which are illustrated in FIG. 1.

As described above, the memory device 100 of FIG. 1 may include the plurality of memory cell arrays 110. Each of the memory cell arrays 110 may store data inputted/outputted in parallel through the plurality of data input/output lines IO. For example, the memory device 100 may include eight memory cell arrays 110. When the memory device 100 has a burst length of 16, data may be read from/written to each of the memory cell arrays 110 in parallel through 16 data input/output lines IO1<0:15> to IO8<0:15>. The following descriptions will be focused on such an embodiment, but the present disclosure is not limited thereto.

Referring to FIG. 2, the input/output circuit 160 may include eight data transmitters 220_1 to 220_8 corresponding to the respective memory cell arrays 110. The data transmitters 220_1 to 220_8 may transmit data read in parallel through the 16 data input/output lines IO1<0:15> to IO8<0:15> from the memory cell arrays 110.

For example, a first data transmitter 220_1 may correspond to the first memory cell array of the memory cell arrays 110 in FIG. 1. The first data transmitter 220_1 may transmit data to the corresponding output lines. The data may be read in parallel through the 16 data input/output lines IO1<0:15> from the first memory cell array.

The first data transmitter 220_1 may include a repeater. That is, the first data transmitter 220_1 may drive the logic levels of the data input/output lines IO1<0:15> to the logical levels of the output lines. Hereafter, for convenience, the output lines of the data transmitters 220_1 to 220_8 will be represented by the same reference numerals as the data input/output lines IO1<0:15> to IO8<0:15>.

Similarly, an eighth data transmitter 220_8 may correspond to the last memory cell array of the memory cell arrays 110 in FIG. 1. The eighth data transmitter 220_8 may transmit data to the corresponding output lines IO8<0:15>. The data may be read in parallel through the 16 data input/output lines IO8<0:15> from the last memory cell array.

The test circuit 170_1 may include a plurality of combination units 210_1 to 210_16 corresponding to the 16 output lines IO1<0:15> to IO8<0:15> of the data transmitters 220_1 to 220_8, respectively.

During a test mode, the combination units 210_1 to 210_16 may combine output signals of the corresponding output lines IO1<0:15> to IO8<0:15> in response to the test mode signal TM generated through the control logic 130. That is, the combination units 210_1 to 210_16 may compare the logic levels of the corresponding output lines IO1<0:15> to IO8<0:15>, and output the comparison result to output lines T<0:15>.

For example, the first combination unit 210_1 may correspond to the first output lines IO1<0> to IO8<0> of the data transmitters 220_1 to 220_8. The first combination unit 210_1 may perform a logical operation (e.g., an XOR operation) on output signals of the first output lines IO1<0> to IO8<0> of the data transmitters 220_1 to 220_8. Thus, when the logic levels of the output signals of the first output lines IO1<0> to IO8<0> of the data transmitters 220_1 to 220_8 are different, the first combination unit 210_1 may output a high-level signal to the output line T<0>.

Similarly, the 16th combination unit 210_16 may correspond to the last output lines IO1<15> to IO8<15> of the data transmitters 220_1 to 220_8. The 16th combination unit 210_16 may perform a logical operation (e.g., an XOR operation) on output signals of the last output lines IO1<15> to IO8<15> of the data transmitters 220_1 to 220_8. Thus, when the logic levels of the output signals of the last output lines IO1<15> to IO8<15> of the data transmitters 220_1 to 220_8 are different, the 16th combination unit 210_16 may output a high-level signal to the output line T<15>.

The input/output circuit 160 may further include eight serializers 230_1 to 230_8 corresponding to the eight data transmitters 220_1 to 220_8, respectively. The serializers 230_1 to 230_8 may sequentially output data transmitted in parallel from the corresponding data transmitters 220_1 to 220_8 to data input/output pads DQ1 to DQ8.

During the test mode, the combination units 210_1 to 210_16 may compare the logical levels of the corresponding output lines IO1<0:15> to IO8<0:15>, and output the comparison results to one of the serializers 230_1 to 230_8, for example, the first serializer 230_1. Therefore, the first serializer 230_1 may sequentially output the comparison results transmitted through the output lines T<0:15> of the combination units 210_1 to 210_16 to the first data input/output pad DQ1.

In accordance with the present embodiment, the same data may be written to the plurality of memory cell arrays 110 during the test mode. The written data may be read again in parallel through the input/output lines IO1<0:15> to IO8<0:15> of the plurality of memory cell arrays 110. The read data may be compared by the combination units 210_1 to 210_16, and the comparison results may be sequentially outputted through the one data input/output pad DQ1. Therefore, it is possible to rapidly check whether each of the memory cells included in the memory cell arrays 110 has a defect. Furthermore, since the one data input/output pad DQ1 is used, the test equipment may test a plurality of memory devices at the same time, which makes it possible to reduce the test time and cost.

Figure 3:
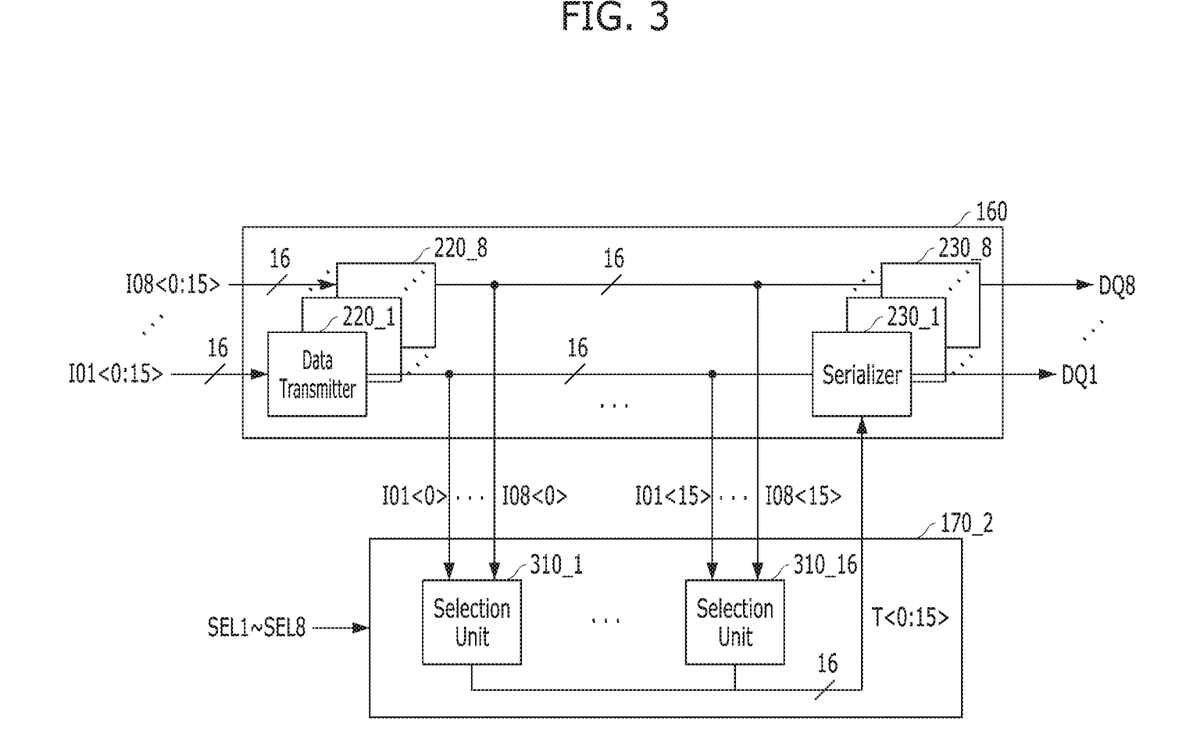
FIG. 3 is a block diagram illustrating an input/output circuit and a test circuit in accordance with another embodiment of the present invention.

FIG. 3 is a block diagram illustrating an input/output circuit and a test circuit in accordance with another embodiment of the present invention, for example, the input/output circuit 160 and the test circuit 170, which are illustrated in FIG. 1.

As described above, the memory device 100 of FIG. 1 may include the eight memory cell arrays 110, and data may be read from/written to each of the memory cell arrays 110 in parallel through the 16 data input/output lines IO1<0:15> to IO8<0:15>. Hereafter, the duplicated descriptions of the same components as those of FIG. 2 will be omitted, and the following descriptions will be focused on a test circuit 170_2 in accordance with another embodiment.

Referring to FIG. 3, during a test mode, the test circuit 170_2 may select one data transmitter of the data transmitters 220_1 to 220_8. Therefore, one data input/output line group may be selected among a plurality of first to eighth data input/output line groups IO1<0:15> to IO8<0:15>. The test circuit 170_2 may output data transmitted through the data input/output lines of the selected group to one serializer of the serializers 230_1 to 230_8, for example, the first serializer 230_1.

FIG. 3 illustrates that the first serializer 230_1 is included in the input/output circuit 160. However, in accordance with the present embodiment, the first serializer 230_1 may be included in the test circuit 170_2. Thus, the test circuit 170_2 may sequentially output the data transmitted in parallel from the selected data transmitter to one data input/output pad of the input/output data pads DQ1 to DQ8, for example, the first data input/output pad DQ1.

The test circuit 170_2 may include a plurality of selection units 310_1 to 310_16 corresponding to the respective data input/output lines of the data input/output line groups IO1<0:15> to IO8<0:15>. That is, the selection units 310_1 to 310_16 may correspond to the 16 output lines IO1<0:15> to IO8<0:15> of the data transmitters 220_1 to 220_8, respectively.

During the test mode, the selection units 310_1 to 310_16 may output data of the data input/output lines of the selected data input/output line group, i.e., the output lines of the selected data transmitter to the output lines T<0:15>, in response to select signals SEL1 to SEL8 generated by the control logic 130. For example, when a first select signal SEL1 is activated by the control logic 130 in the test mode, the first data input/output line group IO1<0:15>, i.e., the first data transmitter 220_1, may be selected by the selection units 310_1 to 310_16. In response to the activated first select signal SEL1, the selection units 310_1 to 310_16 may output the data of the first data input/output line group IO1<0:15>, i.e., the output lines IO1<0:15> of the first data transmitter 220_1, to the first serializer 230_1.

Specifically, the first selection unit 310_1 may correspond to the first output lines IO1<0> to IO8<0> of the data transmitters 220_1 to 220_8. During the test mode, when the first select signal SEL1 is activated, the first selection unit 310_1 may select the first output line IO1<0> of the first data transmitter 220_1 among the first output lines IO1<0> to IO8<0> of the data transmitters 220_1 to 220_8. Then, the first selection unit 310_1 may output the data of the selected output line IO1<0> to the output line T<0>.

Similarly, the 16th selection unit 310_16 may correspond to the last output lines IO1<15> to IO8<15> of the data transmitters 220_1 to 220_8. During the test mode, when the first select signal SEL1 is activated, the 16th selection unit 310_16 may select the last output line IO1<15> of the first data transmitter 220_1 among the last output lines IO1<15> to IO8<15> of the data transmitters 220_1 to 220_8. Then, the 16th selection unit 310_16 may output the data of the selected output line IO1<15> to the output line T<15>.

Thus, the data of the output lines IO1<0:15> of the first data transmitter 220_1 may be transmitted to the first serializer 230_1 by the first to 16th selection units 310_1 to 310_16. The first serializer 230_1 may sequentially output the transmitted data through the first data input/output pad DQ1.

Each of the selection units 310_1 to 310_16 may include a first multiplexer. The first multiplexer may include a 1:8 multiplexer which selects and outputs one of eight input signals. At this time, each of the serializers 230_1 to 230_8 may include a second multiplexer. The second multiplexer may include a 1:16 multiplexer which selects and outputs one of 16 input signals.

In accordance with the present embodiment, during the test mode, the control logic 130 of FIG. 1 may perform a count operation in response to a signal inputted from outside. The control logic 130 may sequentially generate the select signals SEL1 to SEL8 based on the count operation. In response to the sequentially generated select signals SEL1 to SEL8, the selection units 310_1 to 310_16 may sequentially select the data transmitters 220_1 to 220_8. Then, the selection units 310_1 to 310_16 may output the data of the output lines of the selected data transmitter to the first serializer 230_1. Such an operation will be described in more detail based on the signal waveform diagram of FIG. 4.

As the number of bits whose phases are changed in data inputted to/outputted from the memory device 100 increases in comparison to the previous data, simultaneous switching noise (SSN) and an inter-symbol interface (ISI) may occur. Therefore, when the data inputted to/outputted from the memory device 100 includes a larger number of flipped bits than at the previous point of time, the memory device may invert the data using data bus inversion (DBI) circuits included therein. Alternatively, the DBI circuits may count the bit of a specific logic level in the data inputted to/outputted from the memory device 100, and invert the data based on the count value. Therefore, data containing a relatively small number of bits having the specific logic level may be written/read to reduce a peak current which may occur in the memory device 100.

The DBI circuits may correspond to the 16 output lines IO1<0:15> to IO8<0:15> of the data transmitters 220_1 to 220_8, respectively, and selectively invert the logic levels of the corresponding output lines. In accordance with the present embodiment, the selection units 310_1 to 310_16 may be arranged adjacent to the DBI circuits, and share input lines of the DBI circuits.

Figure 4:
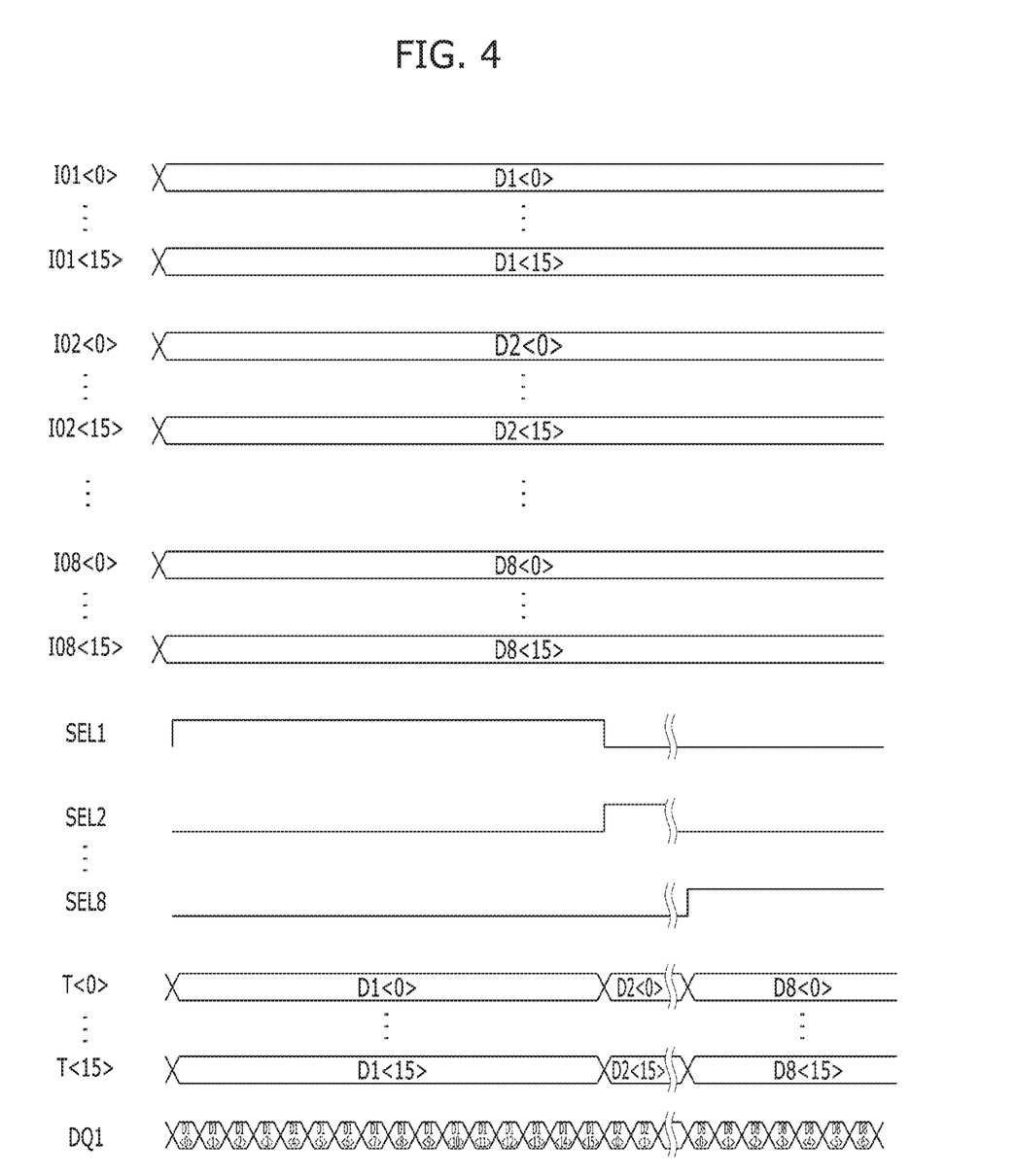
FIG. 4 is a signal waveform diagram of an input/output circuit and a test circuit in accordance with an embodiment of the present invention.

FIG. 4 is a signal waveform diagram of an input/output circuit and a test circuit in accordance with an embodiment of the present invention, for example, the input/output circuit 160 and the test circuit 170_2 which are illustrated in FIG. 3. As described above, FIG. 4 illustrates the case in which the control logic 130 of FIG. 1 performs a count operation, and sequentially generates the select signals SEL1 to SEL8.

During the test mode, test data may be written to the plurality of memory cell arrays 110. The written test data may be read in parallel through the data input/output line groups IO1<0:15> to IO8<0:15> corresponding to the respective memory cell arrays 110.

When a signal indicating the test mode is inputted from outside, the control logic 130 may sequentially generate the select signals SEL1 to SEL8 at predetermined time intervals. The control logic 130 may perform a count operation to sequentially generate the select signals SEL1 to SEL8 whenever the count value approaches a reference value.

Referring to FIG. 4, the first select signal SEL1 may be first activated by the control logic 130. In response to the activated first select signal SEL1, the selection units 310_1 to 310_16 may select the first data transmitter 220_1. That is, the selection units 310_1 to 310_16 may select data D1<0:15> of the first data input/output line group IO1<0:15> and output the selected data to the output lines T<0:15>. Therefore, the first serializer 230_1 may sequentially output the data D1<0:15> inputted through the output lines T<0:15> to the first data input/output pad DQ1.

When a predetermined time elapses after the first select signal SEL1 was activated, the control logic 130 may activate the second select signal SEL2. In response to the activated second select signal SEL2, the selection units 310_1 to 310_16 may select the second data transmitter 220_2. That is, the selection units 310_1 to 310_16 may select data D2<0:15> of the second data input/output line group IO2<0:15> and output the selected data to the output lines T<0:15>. The first serializer 230_1 may sequentially output the data D2<0:15> inputted through the output lines T<0:15> to the first data input/output pad DQ1 following the data D1<0:15>.

When the select signals SEL1 to SEL8 are sequentially activated, the eighth select signal SEL8 may be finally activated. In response to the activated eighth select signal SEL8, the selection units 310_1 to 310_16 may select the eighth data transmitter 220_8. That is, the selection units 310_1 to 310_16 may select data D8<0:15> of the eighth data input/output line group IO8<0:15> and output the selected data to the output lines T<0:15>. The first serializer 230_1 may sequentially output the data D8<0:15> inputted through the output lines T<0:15> to the first data input/output pad DQ1.

In accordance with the present embodiment, during the test mode, the data written in all of the memory cells of the memory cell arrays 110 may be read again and checked. The written data and the read data may be compared to detect the position of a memory cell in which a defect occurred, that is, the address of data in which the defect occurred. Therefore, the memory device may be more accurately tested.

Furthermore, since only one data input/output pad DQ1 is used while the data of all the memory cells are checked, the number of input/output lines used for a test operation may be reduced, and various memory devices may be tested. As a result, the reliability of the test operation may be improved without increasing the time and cost required for testing the memory devices.

In accordance with the present embodiment, during the test mode of the memory device, the test circuit may write data to a plurality of memory cells included in the memory device, and read and check the written data. The test circuit may compare the written data and the read data, and not only check whether a defect occurred, but also detect the position of a memory cell in which a defect occurred.

Furthermore, since data of a plurality of memory cells are checked through only one data input/output pad, the reliability of the test operation may be increased while testing a plurality of memory devices at the same time. Thus, it is possible to reduce the time and cost required for testing the memory devices.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a plurality of memory cell arrays;
   a plurality of data transmitters corresponding to the plurality of memory cell arrays, respectively, and suitable for transmitting data read in parallel from the corresponding memory cell arrays; and
   a test circuit suitable for selecting one data transmitter among the plurality of data transmitters, and sequentially outputting data transmitted in parallel from the selected data transmitter to one data input/output pad among a plurality of data input/output pads, during a test mode.

2. The memory device of claim 1, wherein the test circuit comprises:
   a plurality of selection units each corresponding to the respective output lines of the data transmitters and suitable for outputting data of an output line of the selected data transmitter in response to select signals.

3. The memory device of claim 2, further comprising:
   a plurality of serializers corresponding to the respective data transmitters and suitable for sequentially outputting the data transmitted in parallel from the data transmitters to the data input/output pads.

4. The memory device of claim 3, wherein the test circuit comprises one serializer among the plurality of serializers, and
during the test mode, the one serializer receives the data outputted from the selection units in parallel, and sequentially outputs the received data to the one data input/output pad among the data input/output pads.

5. The memory device of claim 2, further comprising:
a control logic suitable for generating the select signals in response to a command inputted from outside, during the test mode.

6. The memory device of claim 5, wherein the control logic performs a count operation to sequentially generate the select signals at set time intervals.

7. The memory device of claim 6, wherein the plurality of selection units sequentially select the data transmitters in response to the sequentially generated select signals, and output the data of the output lines of the selected data transmitter.

8. The memory device of claim 2, further comprising:
a plurality of data bus inversion (DBI) circuits corresponding to the plurality of output lines of the data transmitters, respectively, and suitable for selectively inverting logic levels of the corresponding output lines.

9. The memory device of claim 8, wherein the plurality of selection units are arranged adjacent to the plurality of DBI circuits, and share input lines of the DBI circuits.

10. A memory device comprising:
a plurality of data input/output line groups;
a plurality of serializers corresponding to the respective data input/output line groups and suitable for serializing data transmitted through data input/output lines of the corresponding groups; and
a test circuit suitable for selecting one of the data input/output line groups, and outputting data transmitted through data input/output lines of the selected group to one serializer of the serializers, during a test mode.

11. The memory device of claim 10, wherein the test circuit comprises:
a plurality of first selection units each corresponding to the respective data input/output lines of the data input/output line groups and suitable for outputting data of a data input/output line of the selected group in response to select signals.

12. The memory device of claim 11, further comprising:
a plurality of data input/output pads corresponding to the respective serializers.

13. The memory device of claim 12, wherein each of the serializers comprises:
a second selection unit suitable for sequentially outputting data transmitted in parallel through the data input/output lines of the corresponding group to the corresponding data input/output pad of the data input/output pads.

14. The memory device of claim 13, wherein during the test mode, the second selection unit of the one serializer receives data outputted from the first selection units in parallel, and sequentially outputs the receive data to the corresponding data input/output pad.

15. The memory device of claim 11, further comprising:
a control logic suitable for generating the select signals in response to a command inputted from outside, during the test mode.

16. The memory device of claim 15, wherein the control logic performs a count operation to sequentially generate the select signals at set time intervals.

17. The memory device of claim 16, wherein the plurality of first selection units sequentially select the data input/output line groups in response to the sequentially generated select signals, and output the data of the data input/output lines of the selected group.

18. The memory device of claim 11, further comprising:
a plurality of data bus inversion (DBI) circuits corresponding to the plurality of data input/output lines of the data input/output line groups, respectively, and suitable for selectively inverting logic levels of the corresponding data input/output lines.

19. The memory device of claim 18, wherein the plurality of first selection units are arranged adjacent to the plurality of DBI circuits, and share input lines of the DBI circuits.

20. A memory device comprising:
a plurality of memory cell arrays;
a plurality of data transmitters corresponding to the plurality of memory cell arrays, respectively, each data transmitter suitable for receiving data from the corresponding memory cell arrays, and transmitting the received data;
a plurality of data input/output line groups corresponding to the plurality of data transmitters, respectively;
a plurality of serializers, each serializer coupled to the corresponding data transmitter through corresponding data input/output line group and coupled to a corresponding data pad among a plurality of data pads, suitable for serializing data from the corresponding data transmitter; and
a test circuit including at least one selection unit coupled to the plurality of data transmitters through a plurality of lines, suitable for receiving data from one data transmitter, which is sequentially selected from among the plurality of data transmitters, and outputting data from the sequentially selected one data transmitter to the selected one data pad from among the plurality of data pads through the corresponding serializer such that the corresponding serializer serializes data from the one selection unit and transmits the serialized data to the selected one data pad.

* * * * *